United States Patent
Yang et al.

(10) Patent No.: US 11,587,636 B2
(45) Date of Patent: Feb. 21, 2023

(54) INTEGRATED CIRCUIT WITH EMBEDDED MEMORY MODULES

(71) Applicant: NXP USA, Inc., Austin, TX (US)

(72) Inventors: Wenbin Yang, Suzhou (CN); Weiwei Sang, Suzhou (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/644,415

(22) Filed: Dec. 15, 2021

(65) Prior Publication Data

US 2022/0199182 A1 Jun. 23, 2022

(30) Foreign Application Priority Data

Dec. 23, 2020 (CN) .......................... 202011555020.7

(51) Int. Cl.
*G11C 29/38* (2006.01)
*G11C 29/04* (2006.01)

(52) U.S. Cl.
CPC ...... *G11C 29/38* (2013.01); *G11C 2029/0401* (2013.01)

(58) Field of Classification Search
CPC ............ G11C 29/38; G11C 2029/0401; G11C 29/12015; G11C 29/32; G01R 31/318555; G01R 31/318533; G01R 31/318597
See application file for complete search history.

(56) References Cited

U.S. PATENT DOCUMENTS

| 7,340,658 | B2 * | 3/2008 | Seuring .......... G01R 31/318544 365/201 |
| 7,831,877 | B2 | 11/2010 | Sul et al. |
| 2002/0194558 | A1 * | 12/2002 | Wang ...................... G06F 30/30 716/106 |
| 2004/0190331 | A1 * | 9/2004 | Ross ...................... G11C 29/48 365/154 |
| 2019/0156908 | A1 * | 5/2019 | Varadarajan ... G01R 31/318597 |

FOREIGN PATENT DOCUMENTS

TW        I268514 B    12/2006

OTHER PUBLICATIONS

Zhiquan Zhang, Zhiping Wen, Lei Chen, Tao Zhou and Fan Zhang, "BIST approach fortesting configurable logic and memory resources in FPGAs," APCCAS 2008—2008 IEEE Asia Pacific Conference on Circuits and Systems, Macao, 2008, pp. 1767-1770.*
X. Cui, M. Zhang, Q. Lin, X. Cui and A. Pang, "Design and Test of the In-Array Build-In Self-Test Scheme for the Embedded RRAM Array," in IEEE Journal of the Electron Devices Society, vol. 7, pp. 1007-1012, 2019.*

* cited by examiner

*Primary Examiner* — Steve N Nguyen

(57) ABSTRACT

The disclosure relates to a system and method for maintaining stability during a scan shift operation on multiple embedded memories in an integrated circuit. Examples disclosed herein include an integrated circuit comprising a plurality of memory modules and a built-in self-test controller, wherein the BIST controller and memory modules are arranged and configured to reduce toggling of cells in the memory modules during a scan shift operation.

8 Claims, 4 Drawing Sheets

INTEGRATED CIRCUIT WITH EMBEDDED MEMORY MODULES

CROSS-REFERENCE TO RELATED APPLICATIONS

This application claims the priority under 35 U.S.C. § 119 of China application no. 202011555020.7, filed on 23 Dec. 2020, the contents of which are incorporated by reference herein.

FIELD

The disclosure relates to a system and method for maintaining stability during a scan shift operation on multiple embedded memories in an integrated circuit.

BACKGROUND

An integrated circuit (IC) may include embedded memory. In some cases, particularly where a larger memory capacity is required, the memory may be divided into multiple smaller memory modules distributed throughout the IC. This can result in a reduced power consumption. Using multiple memory modules does, however, require the use of more boundary logic such as a test multiplexer for each memory address. In a scan shift operation, the normal operation mode of the IC is suspended and multiple flip-flops in the IC are connected as a long shift register. This enables a single input pin to be used to load a serial input test pattern to the scan chain formed by the flip-flops. The result is shifted out of the scan chain and compared with an expected result to verify that the IC is operating correctly. When performing such a scan shift operation in an IC with multiple memory modules, the greater amount of boundary logic may result in a higher toggle rate than during a normal operation mode. This can result in a larger IR drop and may lead to incorrect results during the scan shift operation unless the scan shift operation is slowed down to prevent this happening. Various techniques may be used to reduce this IR drop effect. Alternative test patterns may be used to reduce the number of flip-flops simultaneously switching during the scan shift operation. The design of the IC may be modified by gating off flip-flop outputs during the scan shift operation so that circuit elements driven by the flip-flop outputs do not see any changes. Flip-flops in the scan chain may be designed to have separate output pins for functional and scan connections. Such solutions, however, may require additional hardware or may degrade performance of the IC, and may affect the function of the scan test timing path.

SUMMARY

The disclosure in general relates to an integrated circuit comprising a plurality of memory modules and a built-in self-test (BIST) controller, wherein the BIST controller and memory modules are arranged and configured to reduce toggling of cells in the memory modules during a scan shift operation.

According to a first aspect there is provided an integrated circuit comprising a plurality of memory modules and a built-in self test, BIST, controller, the BIST controller comprising:

a plurality of BIST multiplexers selectable between a respective one of a plurality of BIST inputs and a logic zero by a BIST control input and a scan enable input such that each of the plurality of BIST multiplexers outputs a value of the respective BIST input when the BIST control input is enabled and the scan enable input is not enabled and otherwise outputs the logic zero; and a logic circuit arranged to enable a first BIST mode output when a BIST mode input is enabled and the scan enable input is not enabled and to enable a second BIST mode output when either the BIST mode input or the scan enable input is enabled, each memory module comprising:

a memory;

a first multiplexer having first and second inputs selectable by the second BIST mode output such that first multiplexer passes the output of a respective one of the plurality of BIST multiplexers received at the first input to the memory when the second BIST mode output is enabled and passes a function input to the memory otherwise; and a second multiplexer having first and second inputs selectable by the first BIST mode output such that the second multiplexer passes an output of the memory received at the second input to a BIST output when the first BIST mode output is enabled and passes a logic zero from the first input to the BIST output otherwise.

The use of the memory BIST controller prevents memory boundary logic from toggling during a scan shift operation and can thereby reduce or avoid power issues resulting from an IR voltage drop. During a burn-in scan test the scan enable input may be disabled to allow the memory logic to toggle as much as possible.

An advantage of the BIST controller arrangement is that toggling during a scan shift operation is reduced for a small increase in number of components, which may add minimal or no cost to the overall IC.

The integrated circuit may comprise an inverter having an input connected to the scan enable input and a first AND gate having a first input connected to an output of the inverter and a second input connected to the BIST control input, an output of the first AND gate connected to a select input of each of the plurality of BIST multiplexers.

The logic circuit may comprise a second AND gate, wherein the BIST mode input and the output of the inverter are connected to inputs of the second AND gate, an output of the AND gate providing the first BIST mode output.

The logic circuit may comprise an OR gate, the scan enable input and the BIST mode input being connected to inputs of the OR gate, an output of the OR gate providing the second BIST mode output.

According to a second aspect there is provided a method of operating an integrated circuit according to the first aspect, the method comprising performing a scan shift operation on the memory modules by:

enabling the scan enable input, the BIST control input and the BIST mode input;

providing input signals to the BIST inputs; and receiving output signals from the BIST output of each memory module.

Other features relating to the first aspect may also apply to the integrated circuit according to the second aspect.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
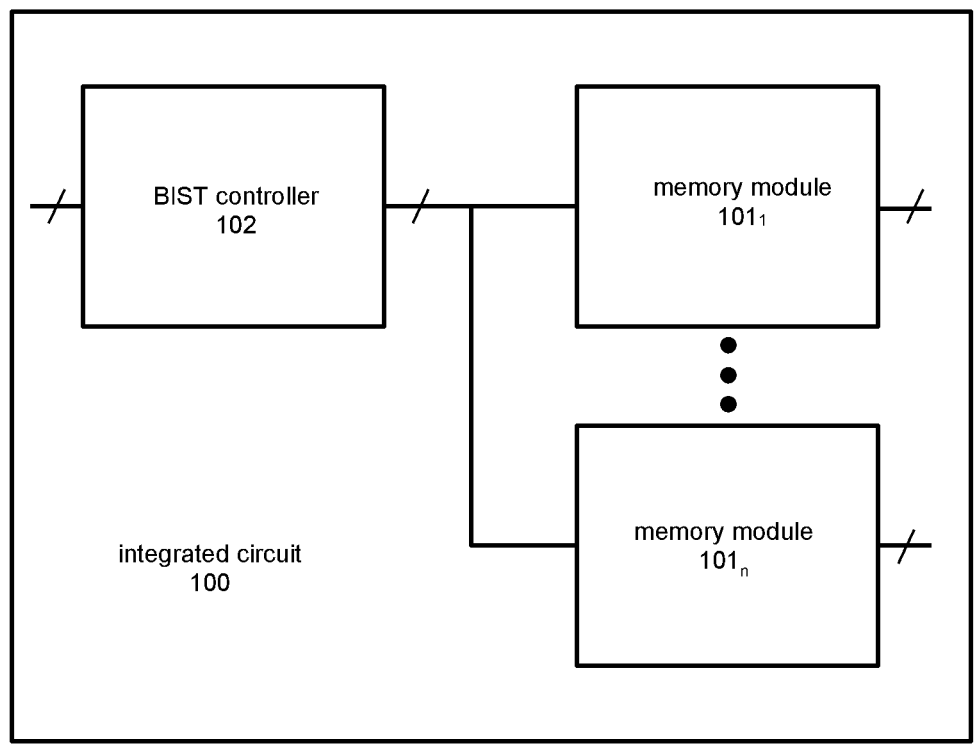
FIG. 1 is a schematic diagram of an integrated circuit with a BIST controller and a plurality of memory modules.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

An example integrated circuit (IC) 100 with multiple memory modules $101_{1-n}$ is illustrated in FIG. 1. Other components may also be present in the IC 100, which are not shown in FIG. 1 for clarity. Operation of each of the memory modules $101_{1-n}$ during a built-in self-test operation is controlled by a BIST controller 102, which provides signals to each memory module $101_{1-n}$ to disable normal operation and instead operate under control of the BIST controller 102.

Figure 2:
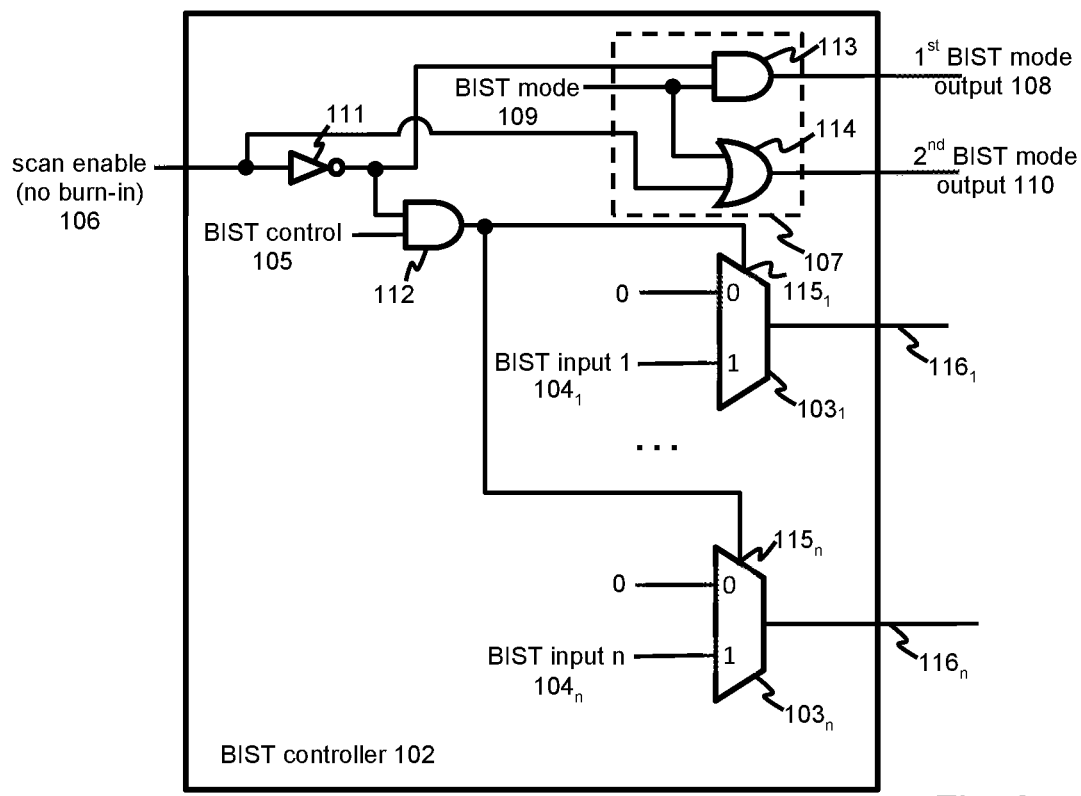
FIG. 2 is a schematic diagram of an example BIST controller.

Further details of the example BIST controller 102 are illustrated in FIG. 2. The BIST controller 102 comprises a scan enable input 106 to enable a scan shift operation, a BIST control input 105 to enable a BIST operation, a BIST mode input 109 to determine the BIST mode to be employed, and a BIST input $104_{1-n}$ for each of n multiplexers $103_{1-n}$. Each multiplexer $103_{1-n}$ comprises a pair of inputs that are selectable via a select input $115_{1-n}$ between a respective one of the plurality of BIST inputs $104_{1-n}$ and a logic zero. Selection of which input to pass through to an output $116_{1-n}$ is determined by a combination of a value on the BIST control input 105 and the scan enable input 106. The scan enable input 106 is provided to an inverter 111, the output of which is provided to a first AND gate 112. The output of the first AND gate is provided to each of the select inputs $115_{1-n}$ of the BIST multiplexers $103_{1-n}$. Each multiplexer $103_{1-n}$ is thereby controlled to pass through a respective BIST input $104_{1-n}$ if the BIST control input 105 is enabled and the scan enable input 106 is not enabled. Otherwise the multiplexers $103_{1-n}$ output the logic zero. Therefore, enabling the scan enable input 106 acts to disable the BIST inputs $104_{1-n}$ from being passed through the multiplexers $103_{1-n}$.

The scan enable input 106 and BIST mode input 109 are provided to a logic circuit 107, which outputs a first and second BIST mode output 108, 110. The logic circuit 107 comprises a second AND gate 113 and an OR gate 114. The BIST mode input 109 and the inverted scan enable input 106 provided by the inverter 111 are input to the second AND gate 113, the output of which provides the first BIST mode output 108. The scan enable input 106 and BIST mode input 109 are provided to the OR gate 114, the output of which provides the second BIST mode output 110.

When a burn-in scan test is required, the scan enable input 106 is disabled so that the memory modules are toggled as much as possible so as to speed up burn-in of the IC under higher temperature and high voltage conditions. The BIST controller 102 may therefore further comprise logic (not shown in FIG. 2) that combines a burn-in scan test mode with the scan enable input such that the input at the scan enable input 106 is only enabled when a burn-in mode is not active.

Figure 3:
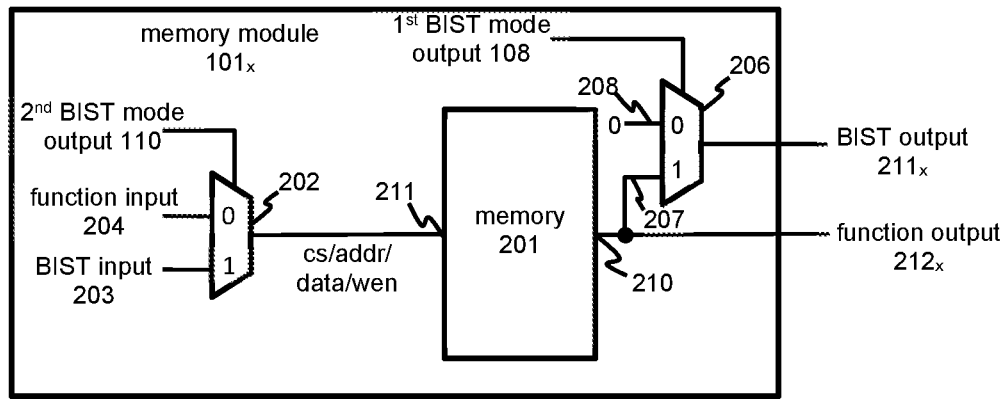
FIG. 3 is a schematic diagram of an example memory module.

FIG. 3 illustrates an example memory module $101_x$, which represents any one of the n memory modules $101_{1-n}$ shown in FIG. 1, i.e. where x is any number from 1 to n. The memory module comprises a memory 201, which has an input 211 and an output 210. A first multiplexer 202 has first and second inputs 203, 204. The first input 203 is provided by one of the outputs $116_{1-n}$ of the BIST multiplexers $103_{1-n}$. The second input 204 is a function input, which is used for providing inputs to the memory 201 under normal operation, i.e. when a BIST operation is not being performed. The first multiplexer 202 is operated under control of the second BIST mode output 110. If enabled, the second BIST mode output 110 causes the first multiplexer 202 to select the BIST input 203, otherwise the first multiplexer 202 selects the function input 204.

The memory module further comprises a second multiplexer 206, also with first and second inputs 207, 208. The inputs 207, 208 of the second multiplexer 206 are selected by the first BIST mode output 108. If enabled, the first BIST mode output 108 causes the second multiplexer 206 to select the memory output 210 to provide to a BIST output $211_x$ of the memory module $101_x$. Otherwise, the second multiplexer 206 selects the second input 208 and provides a logic zero to the BIST output $211_x$. The memory module $101_x$ comprises a function output $212_x$, which provides an output from the memory 201 during normal operations, i.e. when a BIST operation is not being performed.

Figure 4:
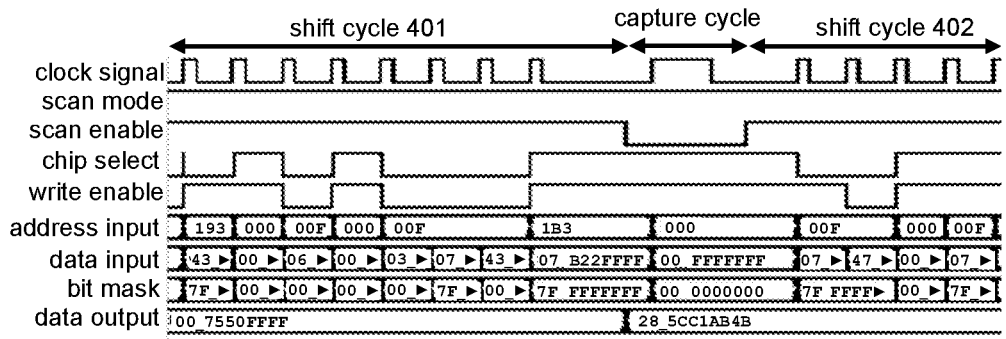
FIG. 4 is a plot of a series of waveforms of memory boundaries over a conventional scan shift operation.

FIG. 4 illustrates various waveforms of memory boundaries during shift cycles while the memory modules are in scan mode, for a conventional IC with multiple memory modules. As can be seen, during the shift cycles 401, 402 the chip select, write enable, address input, data input and bit mask all toggle multiple times, which may result in a detrimental IR drop.

Figure 5:
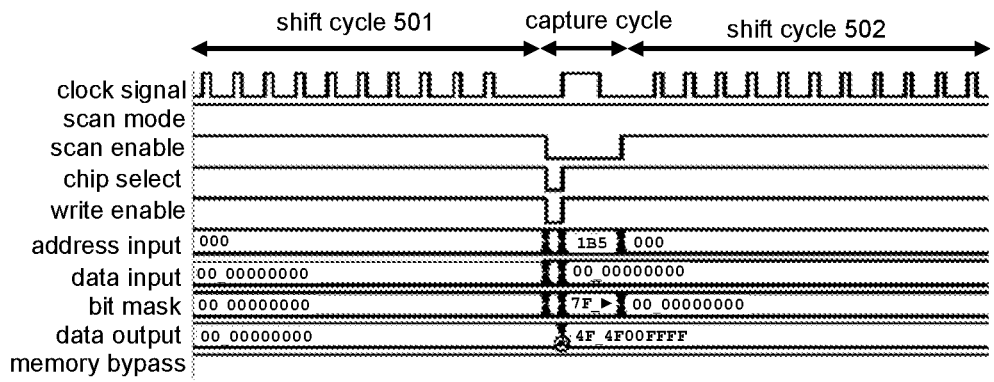
FIG. 5 is a plot of a series of waveforms of memory boundaries over a scan shift cycle using an example BIST controller.

FIG. 5 illustrates a comparable series of waveforms for an integrated circuit incorporating the BIST controller and memory modules as described herein during a scan shift operation. In each of the shift cycles 501, 502 the chip select, write enable, address input, data input and bit mask all remain stable, resulting in a reduced IR drop.

Figure 6:
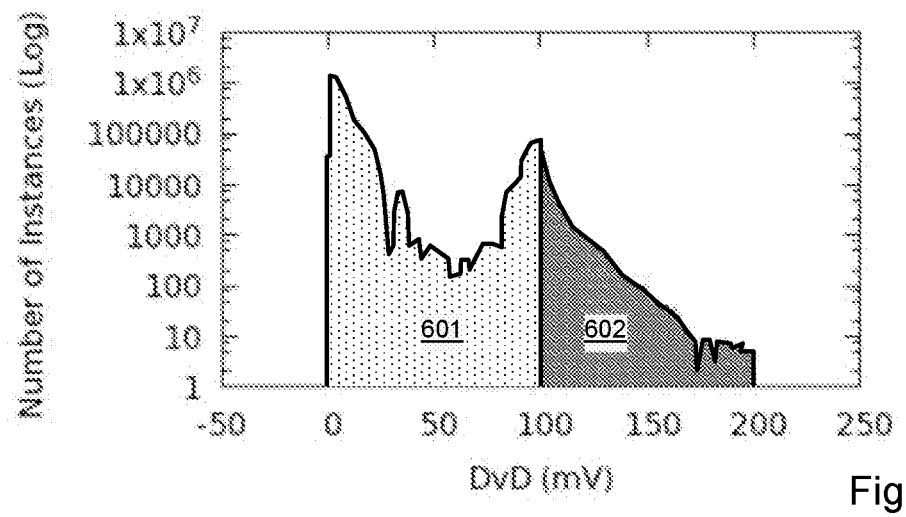
FIG. 6 is a plot of number of instances of IR drop as a function of device voltage for a conventional multi-memory IC.
Figure 7:
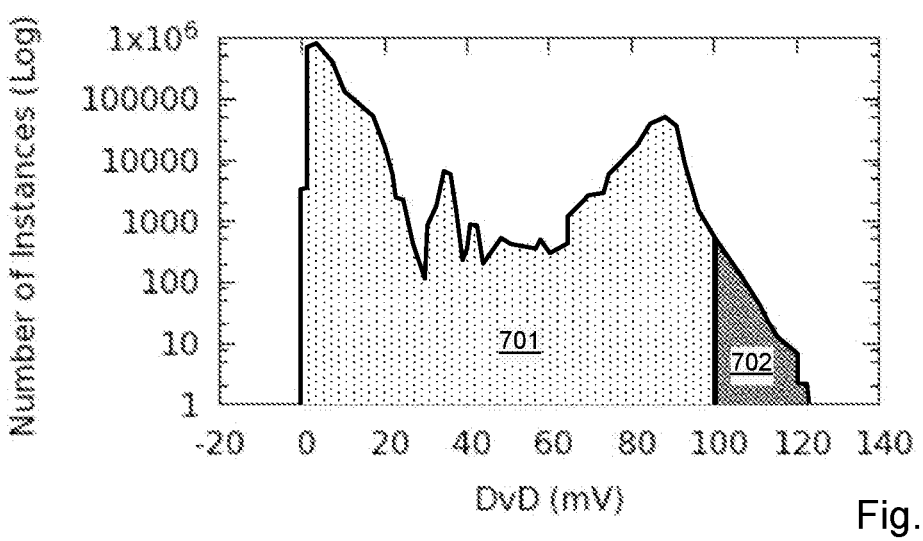
FIG. 7 is a plot of number of instances of IR drop as a function of device voltage for a multi-memory IC incorporating an example BIST controller.

FIGS. 6 and 7 illustrate the effect of the BIST controller and memory modules of the type disclosed herein, showing plots of a number of instances of voltage drop, i.e. the number of cells in a device where the voltage drops, as a function of the voltage drop value. In each case, the plot is shown as two regions. In a first region 601, 701, the cells meet the limitation requirements for a working voltage drop, i.e. up to 100 mV in these examples. In a second region 602, 702, the voltage drops exceed the limitation, which may result in the cells not working correctly or working in an error state. For a conventional IC (FIG. 6), the highest voltage drop is around 200 mV. For an IC with the BIST controller and memory modules as disclosed herein, the highest IR drop is instead around 128 mV, a reduction in over 70 mV with only a minor alteration in the circuitry used in the BIST controller and memory modules.

Figure 8:
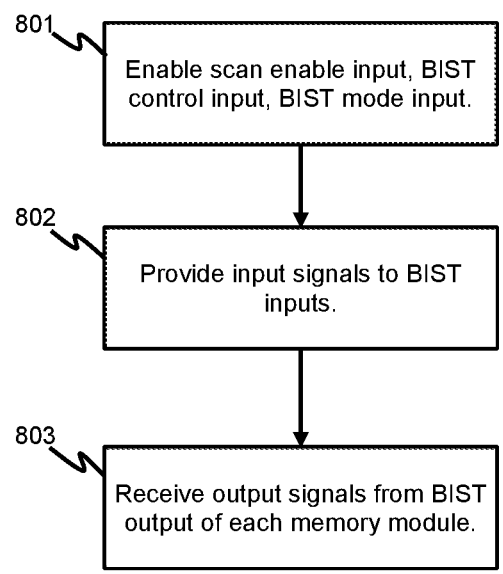
FIG. 8 is a schematic flow diagram illustrating an example method of operating the example IC disclosed herein.

FIG. 8 illustrates an example method of operating the IC described herein, in which a scan shift operation is performed on the memory modules. In a first step 801, the scan enable input, BIST control input and BIST mode input are enabled. In a second step 802, input signals are provided to the BIST inputs. In a third step 803, output signals are received from the BIST output of each memory module. Each of these steps may be carried out simultaneously, and not necessarily in the specific order given in FIG. 8.

From reading the present disclosure, other variations and modifications will be apparent to the skilled person. Such variations and modifications may involve equivalent and other features which are already known in the art of memory systems, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An integrated circuit comprising a plurality of memory modules and a built-in self test, BIST, controller, the BIST controller comprising:
   a plurality of BIST multiplexers selectable between a respective one of a plurality of BIST inputs and a logic zero by a BIST control input and a scan enable input such that each of the plurality of BIST multiplexers outputs a value of the respective BIST input when the BIST control input is enabled and the scan enable input is not enabled and otherwise outputs the logic zero; and
   a logic circuit arranged to enable a first BIST mode output when a BIST mode input is enabled and the scan enable input is not enabled and to enable a second BIST mode output when either the BIST mode input or the scan enable input is enabled, each memory module comprising:
   a memory;
   a first multiplexer having first and second inputs selectable by the second BIST mode output such that first multiplexer passes the output of a respective one of the plurality of BIST multiplexers received at the first input to the memory when the second BIST mode output is enabled and passes a function input to the memory otherwise; and
   a second multiplexer having first and second inputs selectable by the first BIST mode output such that the second multiplexer passes an output of the memory received at the second input to a BIST output when the first BIST mode output is enabled and passes a logic zero from the first input to the BIST output otherwise.

2. The integrated circuit of claim 1, comprising an inverter having an input connected to the scan enable input and a first AND gate having a first input connected to an output of the inverter and a second input connected to the BIST control input, an output of the first AND gate connected to a select input—of each of the plurality of BIST multiplexers.

3. The integrated circuit—of claim 2, wherein the logic circuit comprises a second AND gate, wherein the BIST mode input—and the output of the inverter are connected to inputs of the second AND gate, an output of the AND gate providing the first BIST mode output.

4. The integrated circuit—of claim 2, wherein the logic circuit comprises an OR gate, the scan enable input—and the BIST mode input—being connected to inputs of the OR gate, an output of the OR gate providing the second BIST mode output.

5. A method of operating an integrated circuit comprising a plurality of memory modules and a built-in self test, BIST, controller, the BIST controller comprising:
   a plurality of BIST multiplexers selectable between a respective one of a plurality of BIST inputs and a logic zero by a BIST control input and a scan enable input such that each of the plurality of BIST multiplexers outputs a value of the respective BIST input when the BIST control input is enabled and the scan enable input is not enabled and otherwise outputs the logic zero; and
   a logic circuit arranged to enable a first BIST mode output when a BIST mode input is enabled and the scan enable input is not enabled and to enable a second BIST mode output when either the BIST mode input or the scan enable input is enabled, each memory module comprising:
   a memory;
   a first multiplexer having first and second inputs selectable by the second BIST mode output such that first multiplexer passes the output of a respective one of the plurality of BIST multiplexers received at the first input to the memory when the second BIST mode output is enabled and passes a function input to the memory otherwise; and
   a second multiplexer having first and second inputs selectable by the first BIST mode output such that the second multiplexer passes an output of the memory received at the second input to a BIST output when the first BIST mode output is enabled and passes a logic zero from the first input—to the BIST output otherwise, the method comprising performing a scan shift operation on the memory modules—by:
   enabling the scan enable input, the BIST control input— and the BIST mode input;
   providing input signals to the BIST inputs; and
   receiving output signals from the BIST output—of each memory module.

6. The method of claim 5, wherein the integrated circuit comprises an inverter having an input connected to the scan enable input—and a first AND gate—having a first input connected to an output of the inverter and a second input connected to the BIST control input, an output of the first AND gate connected to a select input—of each of the plurality of BIST multiplexers.

7. The method of claim 6, wherein the logic circuit comprises a second AND gate, wherein the BIST mode input and the output of the inverter are connected to inputs of the second AND gate, an output of the AND gate providing the first BIST mode output.

8. The method of claim 6, wherein the logic circuit—comprises an OR gate, the scan enable input—and the BIST mode input—being connected to inputs of the OR gate, an output of the OR gate providing the second BIST mode output.

* * * * *